United States Patent
Liao et al.

(10) Patent No.: US 9,691,867 B2
(45) Date of Patent: *Jun. 27, 2017

(54) SEMICONDUCTOR DEVICE INCLUDING SPACERS HAVING DIFFERENT DIMENSIONS

(71) Applicant: TAIWAN SEMICONDUCTOR MANUFACTURING CO., LTD., Hsinchu (TW)

(72) Inventors: Chen-Liang Liao, Taichung (TW); Chih-Hsiao Chen, Taichung (TW); Yi-Lii Huang, Zhubei (TW); Yao-Yu Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,003

(22) Filed: Aug. 22, 2016

(65) Prior Publication Data

US 2016/0359010 A1    Dec. 8, 2016

Related U.S. Application Data

(62) Division of application No. 15/076,017, filed on Mar. 21, 2016, now Pat. No. 9,425,274, which is a division (Continued)

(51) Int. Cl.
*H01L 21/3205* (2006.01)
*H01L 29/423* (2006.01)
(Continued)

(52) U.S. Cl.
CPC .. *H01L 29/42376* (2013.01); *H01L 21/28114* (2013.01); *H01L 29/0847* (2013.01);
(Continued)

(58) Field of Classification Search
CPC ......... H01L 29/42376; H01L 29/66545; H01L 29/6656; H01L 29/78; H01L 21/28079; H01L 21/28088
(Continued)

(56) References Cited

U.S. PATENT DOCUMENTS 6,346,450 B1    2/2002  Deleonibus et al.
6,867,128 B2 *  3/2005  Deleonibus ....... H01L 21/28273
                                                        257/E21.204

(Continued)

FOREIGN PATENT DOCUMENTS

CN            1405894 A       3/2003
KR    10-2011-0095116 A       8/2011
(Continued)

OTHER PUBLICATIONS

Chinese Office Action and Search Report, dated Apr. 28, 2017, for Chinese Application No. 201410352441.8.

*Primary Examiner* — Matthew Gordon
(74) *Attorney, Agent, or Firm* — Birch, Stewart, Kolasch & Birch, LLP

(57) ABSTRACT

The semiconductor device structures and methods for forming the same are provided. The semiconductor device structure includes a metal gate over a substrate. A first spacer is formed over sidewalls of the metal gate and having a first height. A second spacer is formed over the sidewalls of the metal gate and having a second height. The first height is higher than the second height. The first spacer is farther from the sidewalls of the metal gate than the second spacer. In addition, the semiconductor device structure includes a dielectric layer formed over the substrate to surround the first spacer and the metal gate.

20 Claims, 6 Drawing Sheets

Related U.S. Application Data of application No. 14/170,959, filed on Feb. 3, 2014, now Pat. No. 9,349,817.

(51) Int. Cl.

| | | |
|---|---|---|
| *H01L 29/66* | (2006.01) | |
| *H01L 29/78* | (2006.01) | |
| *H01L 29/165* | (2006.01) | |
| *H01L 29/08* | (2006.01) | |
| *H01L 29/49* | (2006.01) | |
| *H01L 21/28* | (2006.01) | |

(52) U.S. Cl.
 CPC ........ *H01L 29/165* (2013.01); *H01L 29/4958* (2013.01); *H01L 29/4966* (2013.01); *H01L 29/6656* (2013.01); *H01L 29/66545* (2013.01); *H01L 29/78* (2013.01); *H01L 29/7834* (2013.01); *H01L 29/7848* (2013.01); *H01L 21/28079* (2013.01); *H01L 21/28088* (2013.01)

(58) Field of Classification Search
 USPC .................................................. 257/E21.205
 See application file for complete search history.

(56) References Cited

U.S. PATENT DOCUMENTS

| | | |
|---|---|---|
| 2003/0030103 A1 | 2/2003 | Ryu et al. |
| 2009/0166766 A1 | 7/2009 | Lin et al. |
| 2011/0127589 A1 | 6/2011 | Chen et al. |
| 2011/0198699 A1 | 8/2011 | Hung et al. |

FOREIGN PATENT DOCUMENTS

| | | |
|---|---|---|
| TW | 201242018 | 10/2012 |
| TW | 201347092 | 11/2013 |

\* cited by examiner

SEMICONDUCTOR DEVICE INCLUDING SPACERS HAVING DIFFERENT DIMENSIONS

CROSS REFERENCE TO RELATED APPLICATIONS

This application is a Division application of U.S. patent application Ser. No. 15/076,017, filed on Mar. 21, 2016, which is a Division application of U.S. patent application Ser. No. 14/170,959, filed on Feb. 3, 2014, the entire of which is incorporated by reference herein.

BACKGROUND

The semiconductor integrated circuit (IC) industry continues to improve the integration density of various electronic components (e.g., transistors, diodes, resistors, capacitors, etc.) by continual reductions in minimum feature size, which allow more components to be integrated into a given area. Technological advances in IC materials and design have produced generations of ICs where each generation has smaller and more complex circuits than the previous generation. However, these advances have increased the complexity of processing and manufacturing ICs.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

During the scaling trend, various materials have been implemented for the gate electrode and the gate dielectric of semiconductor devices such as complementary metal-oxide-semiconductor (CMOS) devices. However, there are many challenges related to IC processing and manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
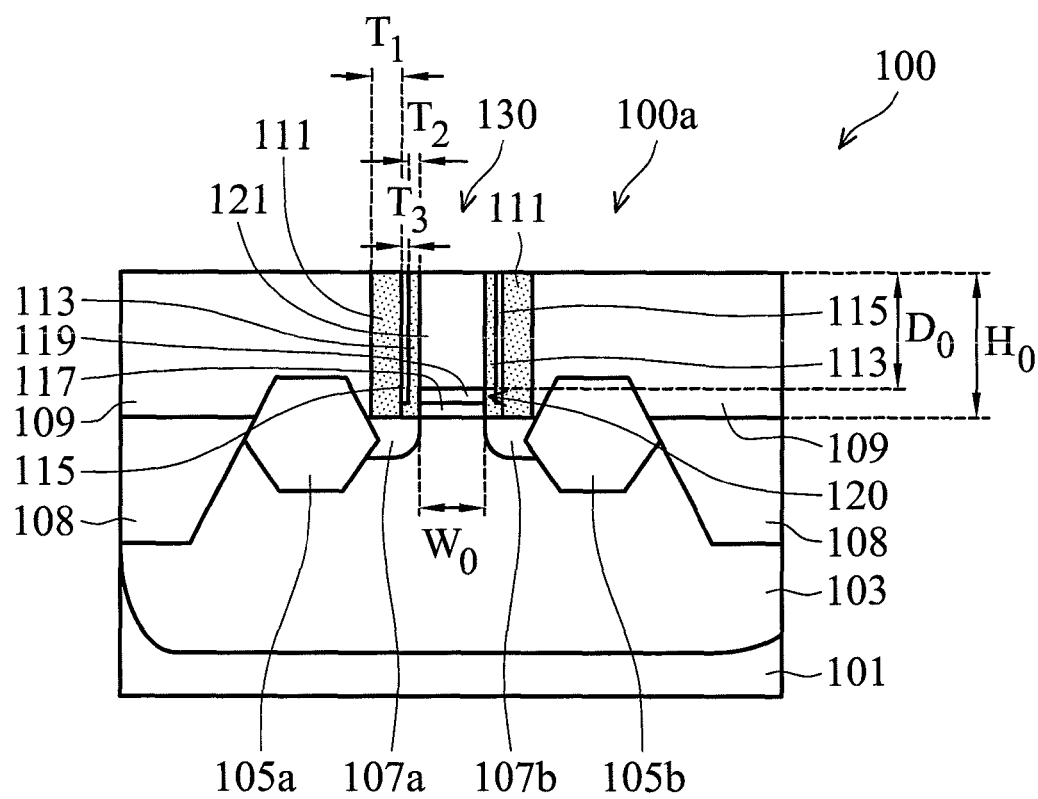
FIGS. 1A-1D show cross-sectional representations of various stages of a process for forming a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. The performance of a first process before a second process in the description that follows may include embodiments in which the second process is performed immediately after the first process, and may also include embodiments in which additional processes may be performed between the first and second processes. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Techniques for forming a metal gate can be cataloged as gate-first processes and gate-last processes. For a gate-first process, the metal gate is formed before formation of source/drain regions of a transistor. A gate-last process forms source/drain regions within a substrate and a dummy gate within an interlayer dielectric (ILD). The dummy gate is removed to form an opening within the ILD. Afterwards, the metal gate is filled within the opening. The gate-first and gate-last processes can be used to form a metal gate of a P-type transistor, an N-type transistor or a complementary metal-oxide-semiconductor (CMOS) transistor.

In the gate-last process, a material layer for the metal gate is deposited over the ILD and to fill the opening formed by removing the dummy gate. If a gate length is decreased to about 32 nm or less and a gate height is increased to about 45 nm or more, the opening would have a high aspect ratio. In some embodiments, it is difficult to fill the opening having a high aspect ratio with materials of the metal gate. As a result, pit and/or void defects would be produced in the metal gate electrode.

In some embodiments, a gate-last process is provided to overcome the pit and/or void defects of the metal gate. The material layer of the metal gate is deposited over the ILD and within an opening which is, for example, a T-shaped profile opening. The T-shaped profile opening has a desired width and a low aspect ratio to be easily filled with the materials of the metal gate without the pit and/or void defects. Moreover, a depth and a width of the opening formed by removing the dummy gate are not changed. The T-shaped profile opening is obtained by reducing a height of a spacer formed over sidewalls of the metal gate to be lower than that of the ILD. Due to the T-shaped profile opening, the capability of filling an opening to form the metal gate would not be limited by a dimension of the dummy gate in the gate-last process. Therefore, the metal gate filling process window is improved. The performance of semiconductor devices is also enhanced.

FIGS. 1A-1D show cross-sectional representations of various stages of a process for forming a semiconductor device 200, in accordance with some embodiments of the disclosure.

Referring to FIG. 1A, a cross-sectional representation of a semiconductor device 100 including a transistor 100a with a dummy gate 130 is shown, in accordance with some embodiments. In some embodiments, the transistor 100a is a P-type transistor formed on a substrate 101. The P-type transistor includes a well region 103 formed within the substrate 101. The well region 103 is an N-well region. The N-well region is configured to provide a channel region of the P-type transistor. In some embodiments, the transistor 100a is an N-type transistor formed on the substrate 101. The N-type transistor includes a well region 103 formed within the substrate 101. The well region 103 is a P-well region. The P-well region is configured to provide a channel region of the N-type transistor. In some embodiments, the transistor 100a is a P-type transistor or an N-type transistor of a CMOS transistor.

In some embodiments, the substrate 101 includes an elementary semiconductor including silicon or germanium in crystal, polycrystalline, or an amorphous structure. In some other embodiments, the substrate 101 includes a compound semiconductor including silicon carbide, gallium arsenic, gallium phosphide, indium phosphide, indium arsenide, or indium antimonide. In some embodiments, the substrate 101 includes an alloy semiconductor including SiGe, GaAsP, AlInAs, AlGaAs, GaInAs, GaInP and/or GaInAsP, other suitable materials, or a combination thereof.

In some embodiments, the alloy semiconductor substrate has a gradient silicon-germanium (SiGe) feature in which the Si and Ge composition change from one ratio at one location to another ratio at another location of the gradient SiGe feature. In some embodiments, the alloy SiGe is formed over a silicon substrate. In some other embodiments, a SiGe substrate is strained.

In some embodiments, the substrate 101 is a semiconductor on insulator, such as a silicon-on-insulator (SOI) substrate. In some examples, the substrate 101 includes a doped epi layer or a buried layer. In some other examples, the substrate 101 includes a multilayer compound semiconductor structure.

In some embodiments, the semiconductor device 100 includes an isolation structure 108 formed between the transistor 100a and other adjacent transistors. The isolation structure 108 insulates the transistor 100a from the adjacent transistor. In some embodiments, the isolation structure 108 is a shallow trench isolation (STI) structure, a local oxidation of silicon (LOCOS) structure, other suitable isolation structures, or a combination thereof.

In some embodiments, the semiconductor device 100 includes stressor structures 105a and 105b formed adjacent to source/drain regions 107a and 107b, respectively. The stressor structures 105a and 105b are, for example, SiGe structures. The source/drain regions 107a and 107b are formed adjacent to a channel region of the transistor 100a. In some embodiments, the transistor 100a is a P-type transistor and the source/drain regions 107a and 107b are p-type source/drain regions. In some other embodiments, the transistor 100a is an N-type transistor and the source/drain regions 107a and 107b are n-type source/drain regions. The p-type source/drain regions 107a and 107b have dopant such as Boron (B) or other group III element. The n-type source/drain regions 107a and 107b have dopants such as Arsenic (As), Phosphorus (P), other group V element, or a combination thereof. Embodiments of the disclosure have many variations. In some embodiments, the stressor structures 105a and 105b are not formed.

Referring to FIG. 1A, a dummy gate 130 is formed over the substrate 101, in accordance with some embodiments. The dummy gate 130 includes a gate dielectric structure 120 and a dummy gate electrode 121 formed over the gate dielectric structure 120. In some other embodiments, the dummy gate 130 only includes the dummy gate electrode 121. The gate dielectric structure 120 is formed over the substrate 101 after the dummy gate electrode 121 is removed. The dummy gate electrode 121 has a width $W_0$ and a height $D_0$. In some embodiments, a first spacer 111, a second spacer 113 and a third spacer 115 are formed on the sidewalls of the dummy gate 130. The first spacer 111 is farther from the dummy gate 130 than the second spacer 113. The first spacer 111 is also referred to as an outer sidewall spacer. The second spacer 111 is also referred to as an inner sealing film. The third spacer 115 is formed between the first spacer 111 and the second spacer 113. The third spacer 115 is also referred to as a buffer sealing film. The first, second and third spacers 111, 113 and 115 are combined to be referred to as a gate spacer.

In some embodiments, the gate spacer only has a single spacer, such as the spacer 111. In some other embodiments, the gate spacer has two spacers, such as the spacers 111 and 113. In some embodiments, the gate spacer further includes one or more other spacers.

As shown in FIG. 1A, an original height $H_0$ of the first spacer 111 is equal to an original height $H_0$ of the second spacer 113, in accordance with some embodiments. The first spacer 111 has a first thickness $T_1$. The second spacer 113 has a second thickness $T_2$. The third spacer 115 has a third thickness $T_3$. In some embodiments, the first thickness $T_1$ is greater than the second thickness $T_2$ and the second thickness $T_2$ is greater than the third thickness $T_3$. In some examples, the width $W_0$ of the dummy gate electrode 121 is in a range from about 26 nm to about 32 nm. For these examples, the first thickness $T_1$ is in a range from about 10 nm to about 15 nm. The second thickness $T_2$ is in a range from about 4.5 nm to about 5.5 nm. The third thickness $T_3$ is in a range from about 1.5 nm to about 2.0 nm. However, the thicknesses T1, T2 and T3 and the width $W_0$ are not limited to the above ranges.

In some embodiments, the first, second and third spacers 111, 113 and 115 include materials such as oxide, nitride, oxynitride, and/or other dielectric materials. In some embodiments, the first spacer 111 and the second spacer 113 are made of silicon nitride. The third spacer 115 is made of silicon oxide. The first, second and third spacers 111, 113 and 115 are formed by deposition, photolithography patterning, etching processes, or a combination thereof. The deposition processes are such as atomic layer deposition (ALD), CVD, physical vapor deposition (PVD), low pressure CVD (LPCVD), plasma enhanced CVD (PECVD), sputtering, other suitable processes, and/or combinations thereof. In some embodiments, the first spacer 111 and the second spacer 113 are deposited by an LPCVD furnace process. The third spacer 115 is deposited by an ALD furnace process.

The photolithography patterning processes include photoresist coating (e.g., spin-on coating), soft baking, mask aligning, exposure, post-exposure baking, developing the photoresist, rinsing, drying (e.g., hard baking), other suitable processes, or a combination thereof. The photolithography exposing process is also implemented or replaced by other proper methods such as maskless photolithography, electron-beam writing, ion-beam writing, or molecular imprint. The etching processes include dry etching, wet etching, or other etching methods (e.g., reactive ion etching). The etching process is also either purely chemical etching (plasma etching), purely physical etching (ion milling), or a combination thereof.

The gate dielectric structure 120 may be a single layer or a multi-layer structure. In some embodiments, the gate dielectric structure 120 includes two gate dielectric layers 117 and 119. The lower gate dielectric layer 117 is, for example, a silicon oxide layer and the upper gate dielectric layer 119 is a high-k dielectric layer. The gate dielectric layers 117 and 119 are formed by deposition, photolithography patterning, etching processes, or a combination thereof.

In some embodiments, the high-k material of the high-k dielectric layer 119 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof. In some embodiments, the high-k material is selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, or a combination thereof.

In some embodiments, the dummy gate electrode 121 includes materials such as silicon, polysilicon, amorphous silicon, or other material that has a desired etch selectivity with respect to the gate dielectric layers 117 and 119 and the spacers 111, 113 and 115. The dummy gate electrode 121 is formed by deposition, photolithography patterning, etching processes, or a combination thereof. The deposition processes include CVD, ALD, other suitable methods, or a combination thereof.

Referring to FIG. 1A, a dielectric layer 109 is formed over the substrate 101 to surround the first spacer 111, in accordance with some embodiments. In some embodiments, the dielectric layer 109 includes materials such as oxide, nitride, oxynitride, low dielectric constant (low-k) dielectric material, ultra low-k dielectric material, extreme low-k dielectric material, other suitable dielectric material, or a combination thereof. The dielectric layer 109 is deposited by, for example, a chemical vapor deposition (CVD) process, a high density plasma CVD (HDPCVD) process, a spin-coating process, another applicable deposition process, or a combination thereof. In some embodiments, the dielectric layer 109 is referred to as an interlayer dielectric (ILD). In some other embodiments, an additional dielectric layer (not shown) is formed below or over the dielectric layer 109. In some embodiments, a contact etch stop layer (not shown) is formed between the dielectric layer 109 and the substrate 101.

In some embodiments, a dielectric material of the dielectric layer 109 is deposited over the substrate 101 after the dummy gate 130 and the spacers 111, 113 and 115 are formed. Afterwards, a portion of the dielectric material is removed by a planarization process, such as a chemical mechanical polishing (CMP) process to provide the dielectric layer 109 with a substantially planar top surface. In some embodiments, the top surface of the dielectric layer 109 is substantially level with a top surface of the dummy gate 130 and top surfaces of the spacers 111, 113 and 115. In other words, the dummy gate 130 and the spacers 111, 113 and 115 are positioned within an opening of the dielectric layer 109. The spacers 111, 113 and 115 are positioned over the sidewalls of the opening of the dielectric layer 109 to surround the dummy gate 130. The spacers 111, 113 and 115 are also referred to as liners.

Figure 1B:
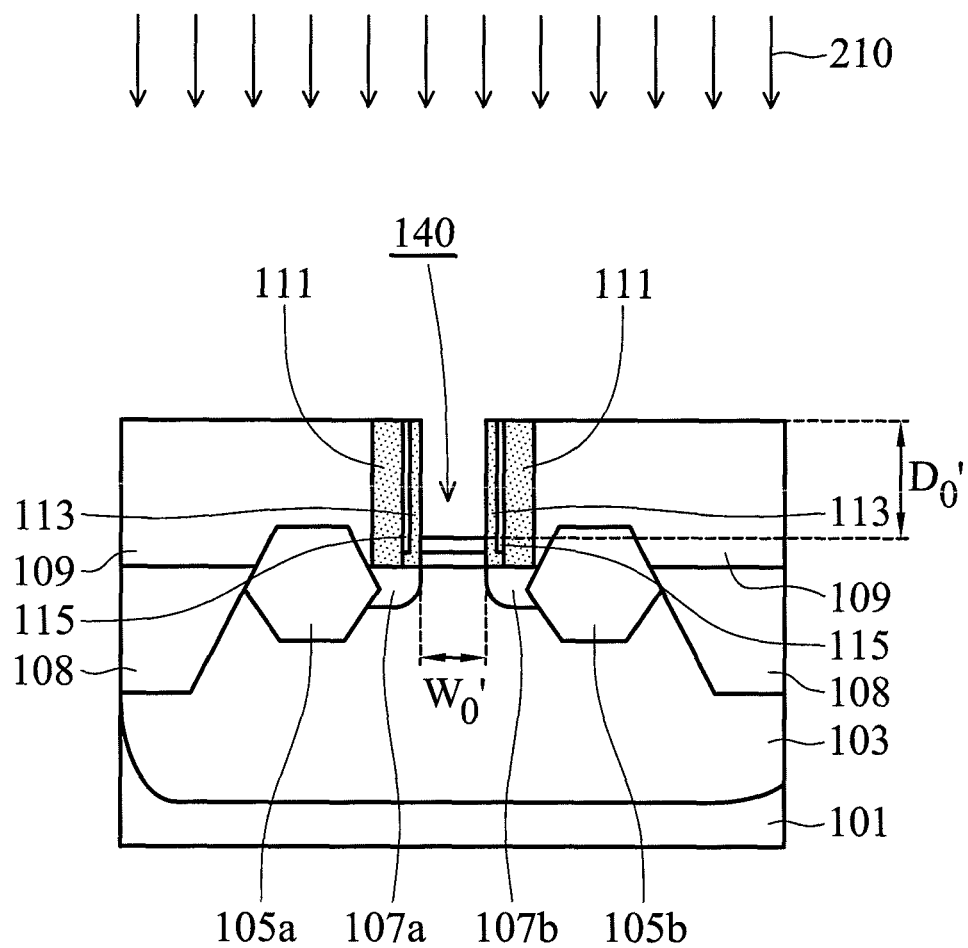

Referring to FIG. 1B, a removing process 210 removes the dummy gate electrode 121 to form an opening 140, in accordance with some embodiments. The opening 140 has a width $W_0'$ and a depth $D_0'$ substantially the same as the width $W_0$ and the height $D_0$ of the dummy gate electrode 121. In some embodiments, the removing process 210 is a wet etch process, a dry etch process, another applicable removing process, or a combination thereof. In some other embodiments, the gate dielectric structure 120 further includes a cap layer (not shown) formed over the high-k dielectric layer 119. The cap layer is capable of protecting the high-k dielectric layer 119 from being damaged by the removing process 210. In some embodiments, the cap layer includes materials such as TiN, TaN, other suitable materials that can resist the removing process, or a combination thereof.

Figure 1C:
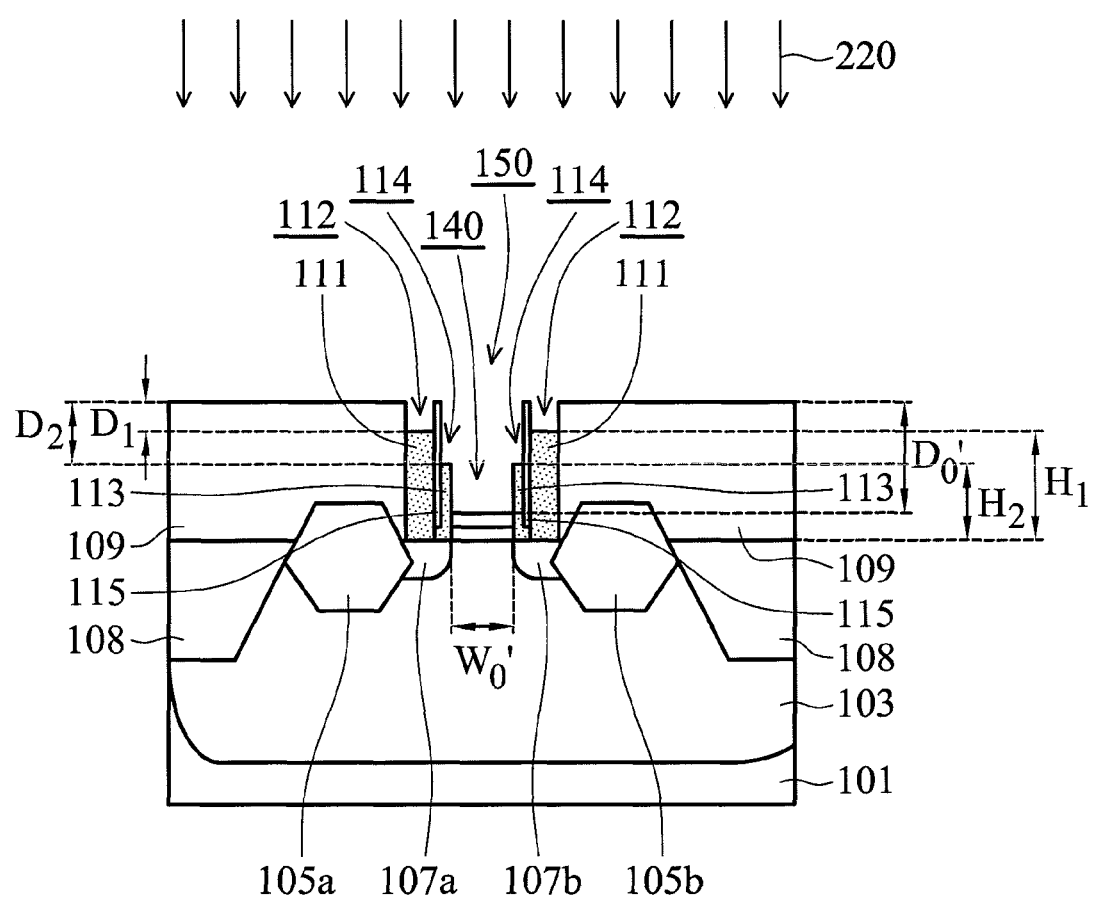

Referring to FIG. 1C, a removing process 220 removes a portion of the first spacer 111 to form a first recess 112, in accordance with some embodiments. The removing process 220 also removes a portion of the second spacer 113 to form a second recess 114 as shown in FIG. 1C, in accordance with some embodiments. After the removing process 220, the original height $H_0$ (as shown in FIG. 1A) of the first spacer 111 is reduced to a first height $H_1$. The original height $H_0$ (as shown in FIG. 1A) of the second spacer 113 is reduced to a second height $H_2$. In some embodiments, the second height $H_2$ of the second spacer 113 is lower than the first height $H_1$ of the first spacer 111. In some embodiments, the third spacer 115 is substantially not removed to keep the original height $H_0$.

In some embodiments, the material of the first spacer 111 is the same as that of the second spacer 113. The material of the third spacer 115 is different from that of the first spacer 111 and the second spacer 113. Therefore, the portions of the first spacer 111 and second spacer 113 are removed together by the removing process 220, but the third spacer 115 is substantially not removed by the removing process 220. In some embodiments, the first thickness T1 (as shown in FIG. 1A) of the first spacer 111 is greater than the second thickness T2 (as shown in FIG. 1A) of the second spacer 113. Therefore, the second spacer 113 is removed at a faster speed than the first spacer 111. As a result, a depth $D_1$ of the first recess 112 is smaller than a depth $D_2$ of the second recess 114. In some embodiments, the depth $D_1$ is in a range from about 10 nm to about 25 nm. The depth $D_2$ is in a range from about 25 nm to about 40 nm. However, the depths $D_1$ and $D_2$ are not limited to the above ranges. The ranges of the depths $D_1$ and $D_2$ are adjusted by geometry sizes of various semiconductor devices to make the inner spacer 113 lower than the outer spacer 111.

In some embodiments, the first spacer 111 and the second spacer 113 are made of the same material of silicon nitride. The third spacer 115 is made of silicon oxide. A portion of the first spacer 111 and a portion of the second spacer 113 are removed together in the same process operation to form the first recess 112 and the second recess 114, respectively. The removing process of the first spacer 111 and the second spacer 113 is performed by a dry etching or a wet etching process. In some embodiments, the dry etching process is a plasma dry etching process using a mixture of several gases, for example $O_2/Cl_2/HBr$. In some other embodiments, the wet etching process is performed using $H_3PO_4$. During the etching process of the first spacer 111 and the second spacer 113, the third spacer 115 is substantially not removed.

As shown in FIG. 1C, the opening 140 and the recesses 112 and 114 are combined to form a T-shaped profile opening 150 from a cross-section view, in accordance with some embodiments. In some other embodiments, the opening 140 and the recesses 112 and 114 are combined to form an opening having a profile other than the T-shaped profile.

The thickness $T_3$ of the third spacer 115 is substantially thinner than the thicknesses $T_1$ and $T_2$ of the first and the second spacers 111 and 113. Therefore, the influence of the third spacer 115 can be omitted. In some other embodiments, the third spacer 115 is partially removed. In some other embodiments, the third spacer 115 is not formed. As shown in FIG. 1C, the opening 140 is formed in the dielectric layer 109 over the substrate 101. The opening 140 is surrounded by the gate spacer, such as the first spacer 111 and the second spacer 113. The first spacer 111 is farther from the center of the opening 140 than the second spacer 113 as shown in FIG. 1C, in accordance with some embodiments.

Figure 1D:
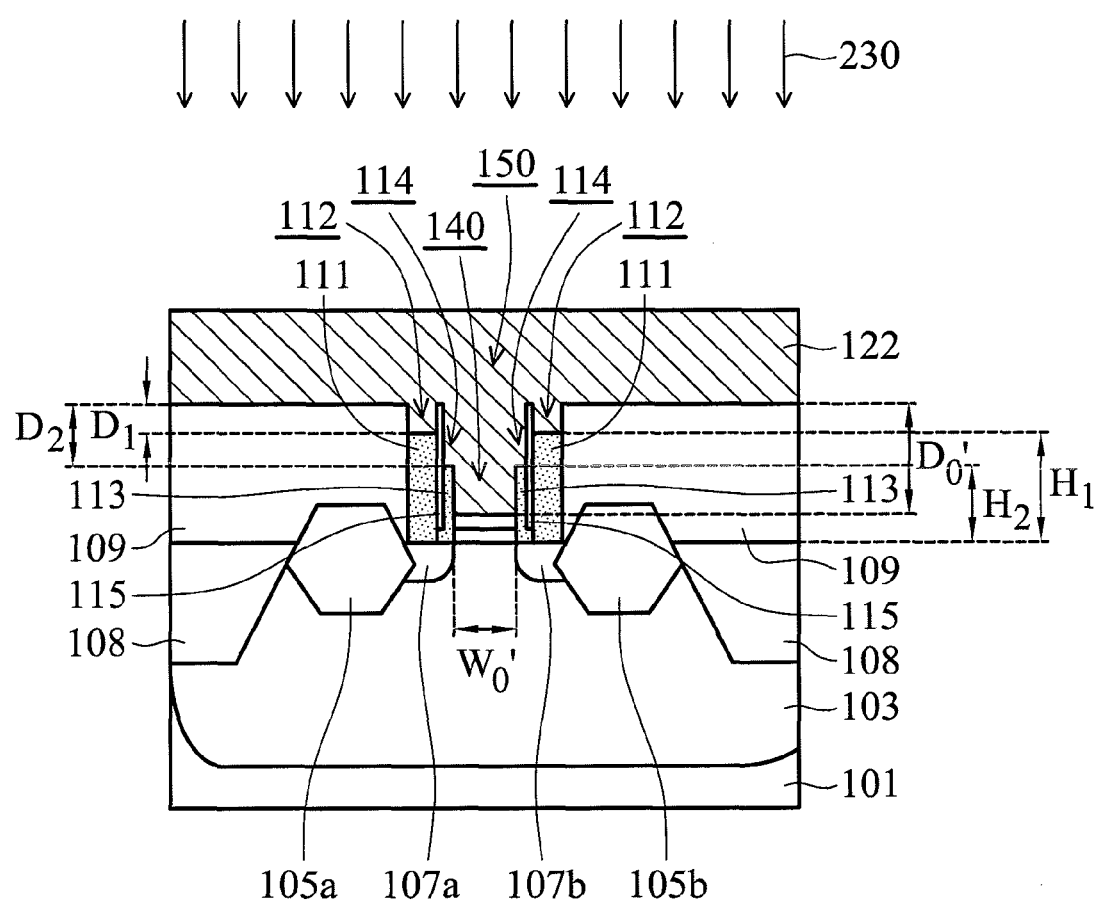

Referring to FIG. 1D, a material layer 122 for forming a metal gate is deposited over the dielectric layer 109 and in the T-shaped profile opening 150, in accordance with some embodiments. Compared with an aspect ratio of the opening 140 (as shown in FIG. 1B), the T-shaped profile opening 150 (as shown in FIG. 1C) has a lower aspect ratio than that of the opening 140. The lower aspect ratio improves the filling ability of the material layer 122 in the T-shaped profile opening 150. Therefore, it substantially prevents pit and void defects from being produced at the material layer 122 within the T-shaped profile opening 150.

In some embodiments, referring to FIG. 1B, the width $W_0'$ of the opening 140 is in a range from about 26 nm to about 32 nm. The depth $D_0'$ of the opening 140 is in a range from about 45 nm to about 65 nm. In an example of the above ranges, the opening 140 has an aspect ratio of about 1.95.

However, in some embodiments, referring to FIG. 1C, the first thickness $T_1$ of the first spacer 111 is in a range from about 10 nm to about 15 nm. The depth $D_1$ of the first recess 112 is in a range from about 10 nm to about 25 nm. The second thickness $T_2$ of the second spacer 113 is in a range from about 4.5 nm to about 5.5 nm. The depth $D_2$ of the second recess 114 is in a range from about 25 nm to about 40 nm. The width $W_0'$ of the opening 140 is in a range from about 26 nm to about 32 nm. The depth $D_0'$ of the opening 140 is in a range from about 45 nm to about 65 nm. In an example of the above ranges, the T-shaped profile opening 150 has an aspect ratio of about 1.14.

As a result, the T-shaped profile opening 150 reduces an aspect ratio from 1.95 to 1.14. Compared with the opening 140 having an aspect ratio of 1.95, it is easier to fill the T-shaped profile opening 150 having an aspect ratio of 1.14 with the material layer 122.

In some embodiments, the material layer 122 may be a single layer or a multi-layer structure. The material layer 122 is deposited in the T-shaped profile opening 150 to forming a metal gate electrode. The material layer 122 includes a p-type work function metallic layer for a P-type transistor or an n-type work function metallic layer for an N-type transistor. The p-type work function metallic layer can adjust the work function value of the metal gate electrode of the P-type transistor. The n-type work function metallic layer can adjust the work function value of the metal gate electrode of the N-type transistor.

In some embodiments, the p-type and the n-type work function metallic layers include materials such as metal, metal carbide, metal nitride, or other suitable material that can provide a desired work function for transistors. In some embodiments, the p-type work function metallic layer includes a material such as ruthenium, palladium, platinum, cobalt, nickel, or conductive metal oxides, e.g., ruthenium oxide, other p-type metallic material that is capable of modulating the work function value of the metal gate electrode of the P-type transistor, or a combination thereof. In some other embodiments, the p-type work function metallic layer includes TiN. In some embodiments, the n-type work function metallic layer includes materials such as hafnium, zirconium, titanium, tantalum, aluminum, metal carbides, other n-type metallic material that is capable of modulating the work function value of the metal gate electrode of the N-type transistor, or a combination thereof. In some other embodiments, the n-type work function metallic layer includes TiAl.

In some embodiments, the p-type and the n-type work function metallic layers are deposited by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, or a combination thereof.

In some embodiments, the material layer 122 further includes materials of a diffusion barrier and a metal gate electrode. In some embodiments, the material of the diffusion barrier includes TiN and Ti. The material of the metal gate electrode is, for example, Al.

In some embodiments, the diffusion barrier and the metal gate electrode are deposited by using PVD such as sputtering and evaporation, plating, CVD such as PECVD, atmospheric pressure CVD (APCVD), low pressure CVD (LPCVD), high density plasma CVD (HDPCVD) and atomic layer CVD (ALCVD), other suitable deposition processes, or a combination thereof.

In some embodiments, the work function material, the diffusion barrier material, and the metal gate electrode material are sequentially deposited within the T-shaped profile opening 150. The work function material and the diffusion barrier material are deposited on the sidewalls of the opening 150 as well as the bottom of the opening 150. The work function material and the diffusion barrier material deposited on the sidewalls reduce the opening width of the opening 150. However, according to some embodiments of the disclosure, the T-shaped profile opening 150 has an aspect ratio of 1.14 or lower. Therefore, it is easier to fill the T-shaped profile opening 150 with the metal gate electrode material. The T-shaped profile opening 150 can prevent or reduce the pit and/or void defects from occurring at the metal gate electrode.

Figure 1E:
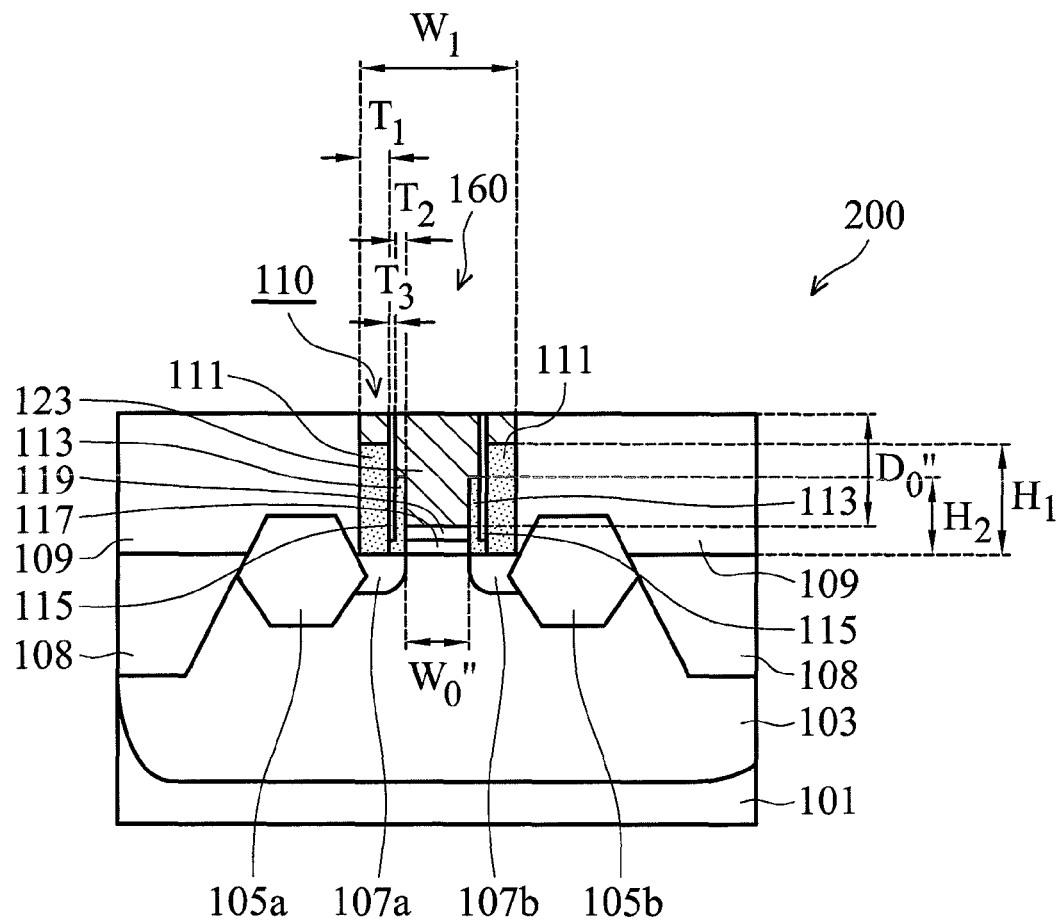
FIG. 1E shows a cross-sectional representation of a semiconductor device, in accordance with some embodiments.

Referring to FIG. 1D, a removing process 230 removes a portion of the material layer 122, in accordance with some embodiments. While the removing process 230 is stopped at a top surface of the dielectric layer 109, a metal gate electrode 123 is formed in the T-shaped profile opening 150, as shown in FIG. 1E in accordance with some embodiments. The metal gate electrode 123 has a top surface level with the top surface of the dielectric layer 109. The removing process 230 includes a chemical-mechanical polish (CMP) process, a dry etch process, a wet etch process, another applicable process, or a combination thereof. The metal gate electrode 123 and the gate dielectric layers 117 and 119 are combined to form a metal gate 160 over the substrate 101. In some embodiments, the metal gate electrode 123 has a gate height $D_0''$ in a range from about 45 nm to about 65 nm. The gate height $D_0''$ of the metal gate electrode 123 is the same as the gate height $D_0$ of the dummy gate electrode 121 (as shown in FIG. 1A). The gate height $D_0''$ of the metal gate electrode 123 is also the same as the depth $D_0'$ of the opening 140 (as shown in FIG. 1B). In some embodiments, the metal gate 160 has a T-shaped profile from a cross-section view and covers the first spacer 111 and the second spacer 113. As shown in FIG. 1E, a semiconductor device 200 is completed, in accordance with some embodiments.

As shown in FIG. 1E, the semiconductor device 200 includes the first spacer 111 formed on the sidewalls of the metal gate 160 and having the first height $H_1$. In some embodiments, the semiconductor device 200 further includes the second spacer 113 formed on the sidewalls of the metal gate 160 and having the second height $H_2$. The first spacer 111 is farther from the sidewalls of the metal gate 160 than the second spacer 113. The first height $H_1$ is higher than the second height $H_2$. In some embodiments, the semiconductor device 200 includes the third spacer 115 formed between the first spacer 111 and the second spacer 113. The third spacer has the third height $H_3$ higher than the first height $H_1$ and the second height $H_2$. The first spacer 111 has the first thickness $T_1$. The second spacer 113 has the second thickness $T_2$. The third spacer 115 has the third thickness $T_3$. In some embodiments, the first thickness $T_1$ is greater than the second thickness $T_2$. In some embodiments, the second thickness $T_2$ is greater than the third thickness $T_3$.

In some embodiments, the semiconductor device 200 includes the source/drain regions 107a and 107b formed on two opposite sides of the metal gate 160. The semiconductor device 200 further includes the dielectric layer 109 formed over the substrate 101 to surround the first spacer 111 and the metal gate electrode 123 of the metal gate 160. The metal gate 160 has a bottom portion near the substrate 101 and a top portion above the bottom portion. In some embodiments, the top portion has a width $W_1$ greater than a width $W_0"$ of the bottom portion. In some embodiments, the metal gate 160 has a top surface level with a top surface of the dielectric layer 109.

In some other embodiments, as shown in FIG. 1E, the semiconductor device 200 includes the dielectric layer 109 formed over the substrate 101. The dielectric layer 109 has an opening 110. The first spacer 111 is formed on the sidewalls of the opening 110. The second spacer 113 is formed on the sidewalls of the first spacer 111. The first spacer 111 is farther from the center of the opening 110 than the second spacer 113. The second spacer 113 has the second height $H_2$ lower than the first height $H_1$ of the first spacer 111. The semiconductor device 200 further includes a conductive material 123 filling in the opening 110 and surrounded by the first spacer 111, the second spacer 113 and the dielectric layer 109. In some embodiments, the conductive material 123 has a T-shaped profile from a cross-section view and covers the first spacer 111 and the second spacer 113. In some embodiments, the conductive material 123 has a top surface level with a top surface of the dielectric layer 109. In some embodiments, the conductive material 123 in the opening 110 has a bottom width $W_0"$ and a top width $W_1$. The top width $W_1$ is greater than the bottom width $W_0"$. The semiconductor device 200 also includes the third spacer 115 between the first spacer 111 and the second spacer 113. The third spacer 115 has a top surface higher than that of the first spacer 111 and the second spacer 113. In some embodiments, the first spacer 111 has the first thickness $T_1$. The second spacer 113 has the second thickness $T_2$. The first thickness $T_1$ is greater than the second thickness $T_2$. In some embodiments, the third spacer 115 has the third thickness $T_3$. The third thickness $T_3$ is smaller than the second thickness $T_2$.

Figure 2:
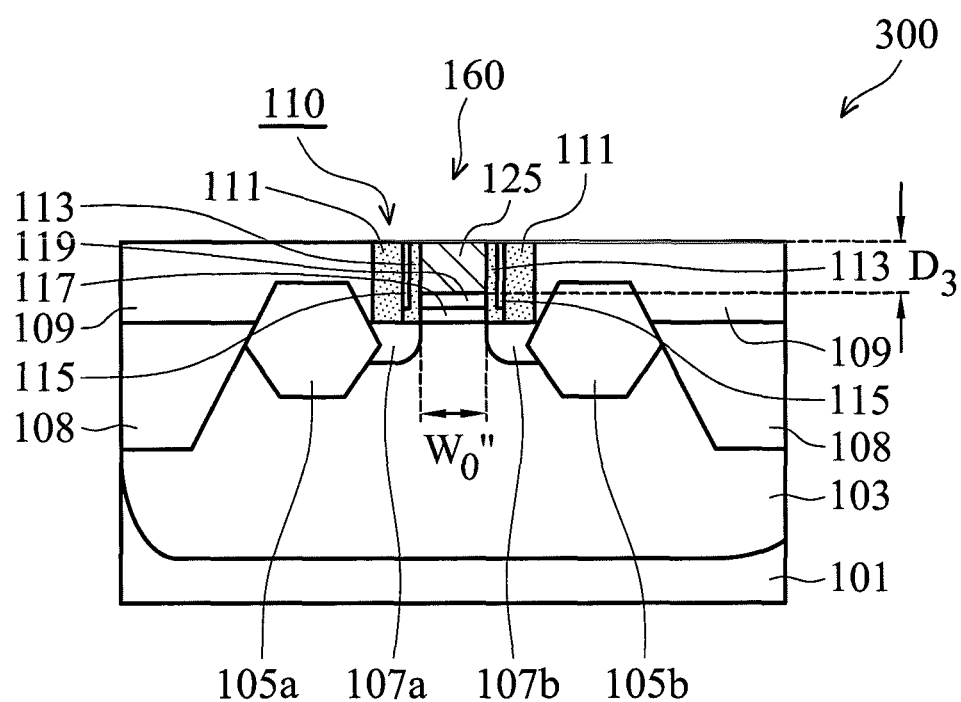
FIG. 2 shows a cross-sectional representation of a semiconductor device, in accordance with some embodiments.

Referring to FIG. 1D and FIG. 2, the removing process 230 removes a portion of the material layer 122, a portion of the first spacer 111 and a portion of the third spacer 115, in accordance with some embodiments. While the removing process 230 is stopped at the top surface of the second spacer 113, as shown in FIG. 2, a metal gate electrode 125 of a semiconductor device 300 is formed. In some embodiments, the metal gate electrode 125 has a top surface level with the top surface of the second spacer 113. The metal gate electrode 125 and the gate dielectric layers 117 and 119 are combined to form a metal gate 160. In some embodiments, the metal gate electrode 125 has a gate height $D_3$ in a range from about 25 nm to about 45 nm. The gate height $D_3$ of the metal gate electrode 125 is lower than the gate height $D_0"$ of the metal gate electrode 123 of the semiconductor device 200. The metal gate electrode 125 of the semiconductor device 300 does not have a T-shaped profile. However, due to the material layer 122 of the metal gate electrode 125 also fills in the T-shaped profile opening 150 in the fabrication process, it can prevent or reduce pit and/or void defects occurring at the metal gate electrode 125.

In some other embodiments, the dimensions of various features of semiconductor devices are not limited to the ranges described above. The ranges described above are provided as examples for the gate length in a range from about 26 nm to about 32 nm. The dimensions of various features can be adjusted for the semiconductor devices desirably applied to any generations of ICs, for example the 25-nm or less technique.

As noted, the material layer 122 for forming the metal gate electrode 123 of the semiconductor device 200 or the metal gate electrode 125 of the semiconductor device 300 is deposited to fill in the T-shaped profile opening 150. In some embodiments, the T-shaped profile opening 150 consists of the first recess 112, the second recess 114 and the opening 140. Therefore, the T-shaped profile opening 150 has a larger width than that of the opening 140 for the material layer 122 to fill therein. As a result, it can prevent pits and voids from being produced in the metal gate electrodes 123 and 125 of the semiconductor devices 200 and 300, respectively.

Since the aspect ratio of the opening for filling with the materials of the metal gate electrode is reduced according to the embodiments of the disclosure, the metal gate filling process window is enlarged. In some embodiments, a smaller width of the dummy gate gets worse pit and/or void defects in the metal gate electrode. In some embodiments, a larger width of the dummy gate improves the metal gate filling capability, but it would degrade the performance of semiconductor devices. However, according to some embodiments of the disclosure, the metal gate filling capability is not limited by the width of the dummy gate in the gate-last process. In some embodiments, the width of the dummy gate, i.e. the gate length is in a range from about 26 nm to about 32 nm. Therefore, the performance of the semiconductor devices of the disclosure is not degraded. Moreover, the pit and/or void defects of the metal gate electrode of the disclosure are also reduced. The product yield of the semiconductor devices of the disclosure is thereby enhanced.

In accordance with some embodiments, semiconductor devices with an improvement in pit and/or void defects of a metal gate and methods for fabricating the semiconductor devices are provided.

In some embodiments, a semiconductor device structure is provided. The semiconductor device structure includes a dielectric layer over a substrate and having an opening. The semiconductor device structure also includes a first spacer over sidewalls of the opening and having a first height. The semiconductor device structure further includes a second spacer over the sidewalls of the first spacer and having a second height. The first spacer is farther from a center of the opening than the second spacer. The second height is lower than the first height. In addition, the semiconductor device structure includes a conductive material filling in the opening.

In some embodiments, a semiconductor device structure is provided. The semiconductor device structure includes a metal gate over a substrate. The semiconductor device structure also includes a first spacer over sidewalls of the metal gate and having a first height. The semiconductor device structure further includes a second spacer over the sidewalls of the metal gate and having a second height. The first spacer is farther from the sidewalls of the metal gate than the second spacer. The first height is higher than the second height. In addition, the semiconductor device structure includes a source/drain region formed on two opposite sides of the metal gate. The semiconductor device structure also includes a dielectric layer formed over the substrate to surround the first spacer and the metal gate.

In some embodiments, a method for forming a semiconductor device structure is provided. The method includes forming an opening in a dielectric layer over a substrate. The method also includes forming a first spacer to surround the opening and having a first height. The method further includes forming a second spacer to surround the opening and having a second height. The first spacer is farther from the opening than the second spacer. The second height is lower than the first height. In addition, the method includes forming a metal gate in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a dielectric layer over a substrate and having an opening;
    a first spacer over sidewalls of the opening;
    a second spacer adjacent to the first spacer, wherein the second spacer has a top surface higher than a top surface of the first spacer, and the first spacer is between the dielectric layer and the second spacer;
    a recess over the first spacer and between the dielectric layer and the second spacer; and
    a conductive material filling in the opening and the recess.

2. The semiconductor device structure as claimed in claim 1, wherein the conductive material has a T-shaped profile from a cross-section view and covers the first spacer.

3. The semiconductor device structure as claimed in claim 2, wherein the conductive material has a top surface level with a top surface of the dielectric layer.

4. The semiconductor device structure as claimed in claim 3, wherein the top surface of the second spacer is level with the top surface of the conductive material.

5. The semiconductor device structure as claimed in claim 1, wherein the conductive material in the opening has a top width greater than a bottom width.

6. The semiconductor device structure as claimed in claim 1, wherein the first spacer has a first thickness greater than a second thickness of the second spacer.

7. The semiconductor device structure as claimed in claim 1, wherein the material of the first spacer is different from that of the second spacer.

8. A semiconductor device structure, comprising:
    a metal gate over a substrate;
    a first spacer over sidewalls of the metal gate and having a first height;
    a source/drain region on two opposite sides of the metal gate;
    a second spacer between the first spacer and the metal gate, wherein the second spacer has a top surface higher than a top surface of the first spacer;
    a dielectric layer over the substrate to surround the first spacer and the metal gate; and
    a recess over the first spacer and between the dielectric layer and the second spacer, wherein a portion of the metal gate is disposed in the recess.

9. The semiconductor device structure as claimed in claim 8, wherein the metal gate comprises a gate dielectric and a metal gate electrode over the gate dielectric, the metal gate has a T-shaped profile from a cross-section view and covers the first spacer.

10. The semiconductor device structure as claimed in claim 9, wherein the metal gate includes a bottom portion near the substrate and a top portion above the bottom portion, and the top portion has a width greater than a width of the bottom portion.

11. The semiconductor device structure as claimed in claim 8, wherein the first spacer has a first thickness greater than a second thickness of the second spacer.

12. The semiconductor device structure as claimed in claim 8, wherein a lateral sidewall of the second spacer is in contact with the first spacer and the metal gate.

13. The semiconductor device structure as claimed in claim 8, wherein the material of the first spacer is different from that of the second spacer.

14. A semiconductor device structure, comprising:
    a gate dielectric over a substrate;
    a conductive material over the substrate;
    a first spacer over the substrate;
    a source/drain region on two opposite sides of the conductive material; and
    a second spacer between the first spacer and the conductive material, wherein the second spacer has a top surface higher than a top surface of the first spacer, the conductive material comprises a first portion over the first spacer and a second portion over the gate dielectric, and the first portion is separated from the second portion by the second spacer.

15. The semiconductor device structure as claimed in claim 14, wherein the conductive material has a T-shaped profile from a cross-section view and covers the first spacer.

16. The semiconductor device structure as claimed in claim 14, wherein the conductive material includes a bottom portion near the substrate and a top portion above the bottom portion, and the top portion has a width greater than a width of the bottom portion.

17. The semiconductor device structure as claimed in claim 14, wherein the first spacer has a first thickness greater than a second thickness of the second spacer.

18. The semiconductor device structure as claimed in claim 14, wherein a lateral sidewall of the second spacer is in contact with the first spacer and the conductive material.

19. The semiconductor device structure as claimed in claim 18, wherein the material of the first spacer is different from that of the second spacer.

20. The semiconductor device structure as claimed in claim 18, wherein the first spacer and the second spacer are directly above the source/drain region.

* * * * *